(12) United States Patent
Anderson

(10) Patent No.: US 11,545,565 B2
(45) Date of Patent: Jan. 3, 2023

(54) SEMICONDUCTOR DEVICE AND METHOD OF FORMING LOW VOLTAGE POWER MOSFETS USING GRAPHENE FOR METAL LAYERS AND GRAPHENE NANORIBBONS FOR CHANNEL AND DRAIN ENHANCEMENT REGIONS OF POWER VERTICAL AND LATERAL MOSFETS

(71) Applicant: IceMos Technology Limited, Belfast (GB)

(72) Inventor: Samuel J. Anderson, Tempe, AZ (US)

(73) Assignee: IceMos Technology Limited

( * ) Notice: Subject to any disclaimer, the term of this patent is extended or adjusted under 35 U.S.C. 154(b) by 0 days.

(21) Appl. No.: 17/075,753

(22) Filed: Oct. 21, 2020

(65) Prior Publication Data
US 2022/0123134 A1   Apr. 21, 2022

(51) Int. Cl.
| | | |
|---|---|---|
| *H01L 21/00* | (2006.01) | |
| *H01L 29/76* | (2006.01) | |
| *H01L 29/16* | (2006.01) | |
| *H01L 21/02* | (2006.01) | |
| *H01L 29/66* | (2006.01) | |

(52) U.S. Cl.
CPC .... *H01L 29/7606* (2013.01); *H01L 21/02378* (2013.01); *H01L 21/02381* (2013.01); *H01L 21/02389* (2013.01); *H01L 21/02392* (2013.01); *H01L 21/02395* (2013.01); *H01L 21/02527* (2013.01); *H01L 29/1602* (2013.01); *H01L 29/1606* (2013.01); *H01L 29/66045* (2013.01)

(58) Field of Classification Search
CPC .......... H01L 29/7606; H01L 21/02378; H01L 21/02381; H01L 21/02389; H01L 21/02392; H01L 21/02395; H01L 21/02527; H01L 29/1602; H01L 29/1606; H01L 29/66045
See application file for complete search history.

(56) References Cited

U.S. PATENT DOCUMENTS 4,472,729 A * 9/1984 Shibata ................. H01L 29/267
                                              257/70
8,138,558 B2   3/2012 Shea et al.
(Continued)

*Primary Examiner* — Richard A Booth
(74) *Attorney, Agent, or Firm* — Robert D. Atkins; Patent Law Group: Atkins and Associates, P.C.

(57) ABSTRACT

A semiconductor device has a substrate and graphene with semiconducting properties or diamond region formed on the substrate. The graphene with semiconducting properties or diamond region is formed on or within the substrate using liquid-phase-epitaxy growth of graphene enabled by a catalytic alloy of Ni and Cu. The substrate can be silicon, silicon carbide, gallium arsenide, gallium nitride, germanium, or indium phosphide. A semiconductor component is formed over the graphene with semiconducting properties or diamond region and substrate. The semiconductor component can be a power MOSFET, IGBT, or CTIGBT with a gate structure formed over the substrate, source region adjacent to the gate structure, and drain region adjacent to the gate structure opposite the source region. The graphene with semiconducting properties or diamond region is formed under a gate of the MOSFET to reduce drain to source resistance, as well as providing radiation hardening for the device.

30 Claims, 14 Drawing Sheets

(56) References Cited

U.S. PATENT DOCUMENTS

| | | | |
|---|---|---|---|
| 2012/0074387 A1* | 3/2012 | King | H01L 21/02057 |
| | | | 257/29 |
| 2012/0181505 A1* | 7/2012 | Lin | H01L 29/78684 |
| | | | 257/29 |
| 2015/0280012 A1* | 10/2015 | Sato | H01L 29/1606 |
| | | | 257/29 |
| 2019/0097000 A1* | 3/2019 | Berry | H01L 21/02381 |

* cited by examiner

SEMICONDUCTOR DEVICE AND METHOD OF FORMING LOW VOLTAGE POWER MOSFETS USING GRAPHENE FOR METAL LAYERS AND GRAPHENE NANORIBBONS FOR CHANNEL AND DRAIN ENHANCEMENT REGIONS OF POWER VERTICAL AND LATERAL MOSFETS

FIELD OF THE INVENTION

The present invention relates in general to a semiconductor device and, more particularly, to a semiconductor device and method of forming low voltage, low $R_{DSON}$, radiation harden power MOSFET using graphene for metal layer interconnects on a substrate and diamond on silicon of graphene on silicon for channel and drain enhancement.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions, such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

MOSFETs are commonly used in electronic circuits, such as communication systems and power supplies. Power MOSFETs are particularly useful when used as electric switches to enable and disable the conduction of relatively large currents. The on/off state of the power MOSFET is controlled by applying and removing a triggering signal at the gate electrode. When turned on, the electric current in the MOSFET flows between the drain and source. When turned off, the electric current is blocked by the MOSFET.

Power MOSFETs are typically arranged in an array of hundreds or thousands of individual MOSFET cells electrically connected in parallel. The MOSFET cell has an inherent drain-source resistance ($R_{DSON}$) in the conducting state. The width of the MOSFET cell influences the electrical resistance of the MOSFET cell. The larger the width, the smaller the resistance. Many applications such as portable electronic devices require a low operating voltage, e.g., less than 5 VDC. The low voltage electronic equipment in the portable electronic devices create a demand for power supplies that can deliver the requisite operating potential.

In FIG. 1, large-scale integrated circuits (LSIs) using silicon semiconductors are used in all kinds of electronic devices, from computers to smartphones and home appliances, and support our lives. LSIs have improved performance and power saving by reducing the size of the device to be configured, but the miniaturization of LSIs is approaching its limit, and the use of other methods and materials is being sought. Since the discovery of graphene in 2004, researchers around the world have been working on graphene synthesis and device applications. After all, graphene has a high mobility of 100,000 cm2/vs at room temperature, which is about 100 times that of silicon, and its excellent electrical properties are epoch-making materials for next-generation device materials.

In FIG. 2, researchers have successfully synthesized graphene nanoribbon (GNR) into semiconductors with a small band gap between the valence band, which is the energy band filled with electrons, and the conduction band through which electrons flow. The size of the bandgap is an important parameter that determines the ease of electricity flow in a semiconductor. For example, silicon is 1.1 eV and germanium is 0.67 eV, which are uniquely determined by the composition of the substance Semiconductor devices are commonly found in modern electronic products.

The structure of graphene, a substance in which carbon atoms are bonded in a plane, is precisely controlled, which is being researched as a next-generation electronic material that exceeds the limits of the current miniaturization of silicon semiconductors. GNR has extremely excellent electrical characteristics as a semiconductor. A GNR is about 2 nanometers wide for 17 atoms, and the band gap related to the ease of electricity flow is as small as about 0.6 eV (electron volt), and it can be used for both insulators and conductors. It has the optimum properties as a material for semiconductors. Graphene is a two-dimensional material in which carbon atoms are connected in a hexagonal grid with the thickness of one atomic layer. It usually has the properties of a conductor, but it is theoretically expected that a band gap will be formed by making a ribbon-shaped GNR that grows thin and long with a width of several nanometers, and that it will have the properties of a semiconductor. GNR technology can significantly reduce the bandgap from about 2 eV to 0.6 eV, so it operates with low power consumption and has high electron mobility. We can expect the realization of power-saving and ultra-high-speed electronic devices that take advantage of the excellent electrical characteristics of GNR such as the Power MOSFETs disclosed in this application.

DETAILED DESCRIPTION OF THE DRAWINGS

Figure 1:
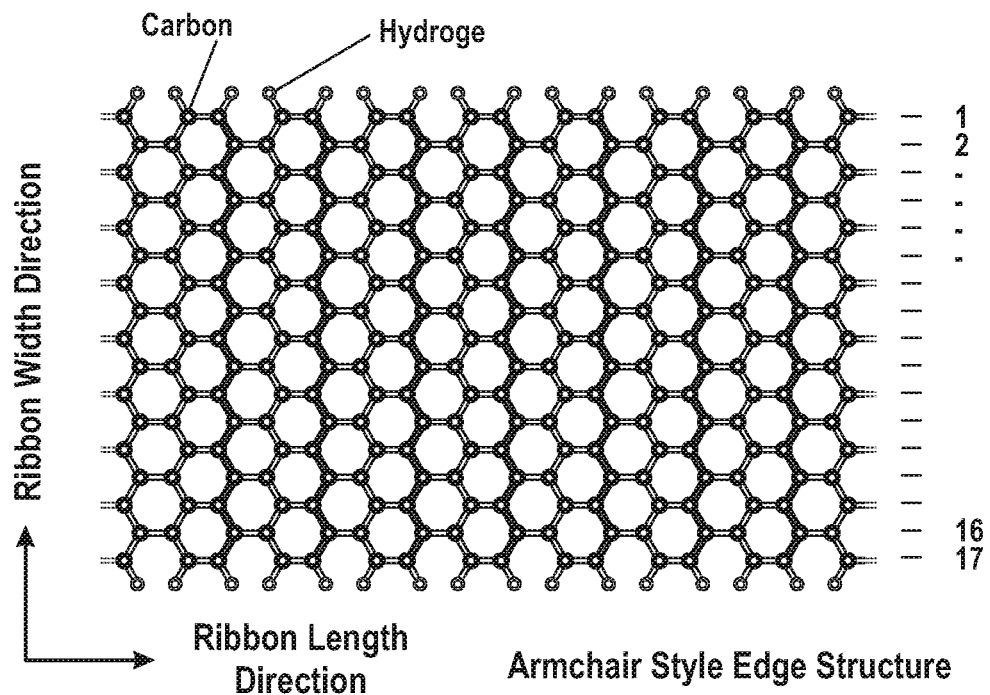
FIG. 1 illustrates a conventional large-scale integrated circuit.
Figure 2:
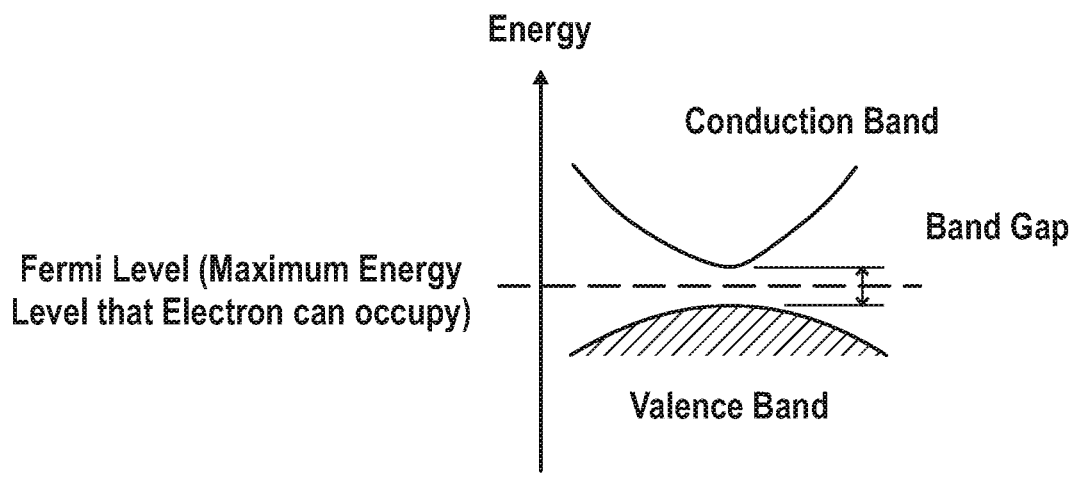
FIG. 2 illustrates a graph of graphene fermi level characteristics.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The term "semiconductor die" as used herein refers to both the singular and plural form of the words, and accordingly, can refer to both a single semiconductor device and multiple semiconductor devices.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Most modern electronic equipment requires a power supply to provide a DC operating potential to the electronic components contained therein. Common types of electronic equipment which use power supplies include personal computers, energy systems, telecommunication systems, audio-video equipment, consumer electronics, automotive components, portable electronics, data processing centers, and other devices which utilize integrated circuits, semiconductor chips, or otherwise require DC operating potential. Many semiconductor components require a low voltage DC operating potential. However, many sources of electric power are AC, or high voltage DC, which must be converted to low voltage DC for the electronic equipment.

Figure 3:
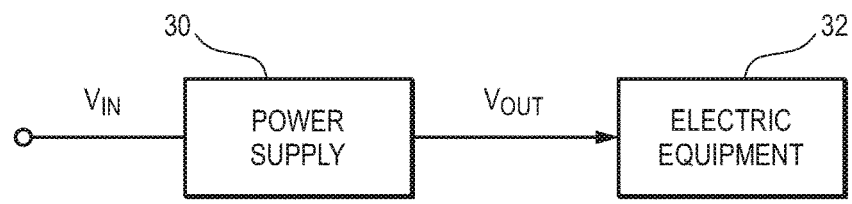
FIG. 3 illustrates a block diagram of a power supply and electronic equipment.

In one common arrangement, the AC/DC power supply receives an AC input voltage, e.g., between 110 and 240 VAC, and converts the AC input voltage to the DC operating voltage. Referring to FIG. 3, a PWM power supply 30 is shown providing a DC operating potential to electronic equipment 32. Power supply 30 receives input voltage $V_{IN}$ and produces one or more DC output voltages. The electronic equipment 32 may take the form of personal computers, energy systems, telecommunication systems, audio-video equipment, consumer electronics, automotive components, portable electronics, data processing centers, and other devices which utilize integrated circuits, semiconductor chips, or otherwise require DC operating potential from the power supply.

Figure 4:
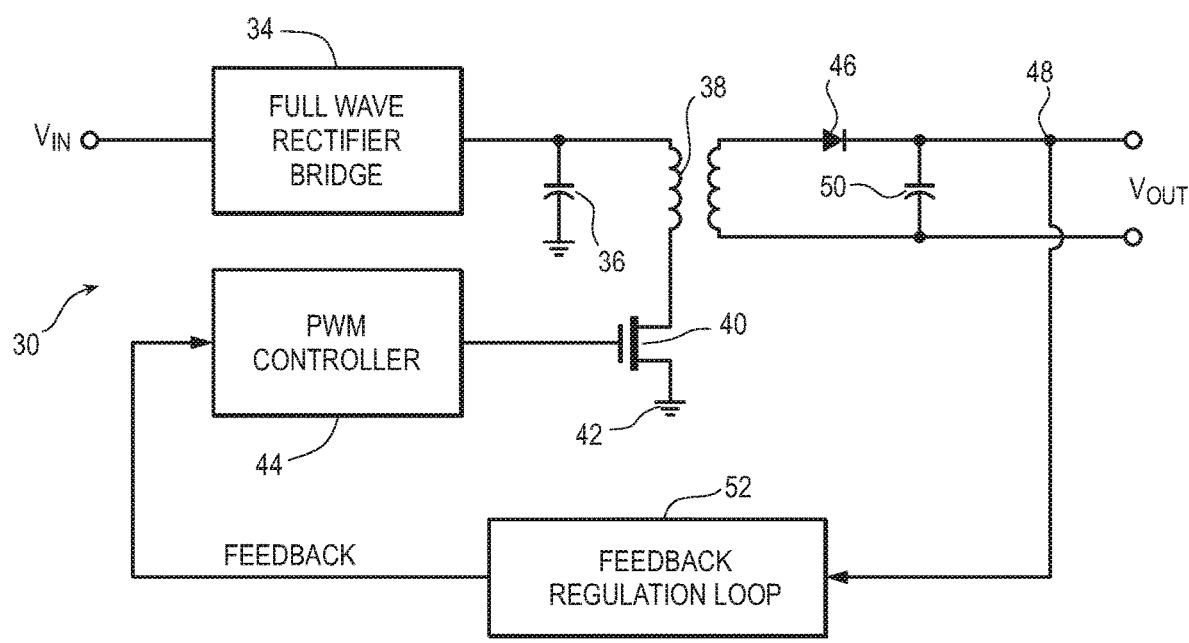
FIG. 4 is a schematic and block diagram of a pulse width modulated power supply.

Further detail of PWM power supply 30 is shown in FIG. 4. The input voltage $V_{IN}$ may be an AC signal, e.g., 110 VAC, or DC signal, e.g., 48 volts. For the case of an AC input voltage, power supply 30 has a full-wave rectifier bridge 34. The full-wave rectifier bridge 34 converts the AC input voltage to a DC voltage. In the case of a DC input voltage, the full-wave rectifier bridge 34 is omitted. Capacitor 36 smoothes and filters the DC voltage. The DC voltage is applied to a primary winding or inductor of transformer 38. The primary winding of transformer 38 is also coupled through power transistor 40 to ground terminal 42. In one embodiment, power transistor 40 is a multi-cell power MOSFET, as described in FIGS. 6a-6r. The gate of MOSFET 40 receives a PWM control signal from PWM controller 44. The secondary winding of transformer 38 is coupled to rectifier diode 46 to create the DC output voltage $V_{OUT}$ of power supply 30 at node 48. Capacitor 50 filters the DC output voltage $V_{OUT}$. The DC output voltage $V_{OUT}$ is routed back through feedback regulation loop 52 to a control input of PWM controller 44. The DC output voltage $V_{OUT}$ generates the feedback signal which PWM controller 44 uses to regulate the power conversion process and maintain a relatively constant output voltage $V_{OUT}$ under changing loads. The aforedescribed electrical components of the power supply module are typically mounted to and electrically interconnected through a printed circuit board.

In the power conversion process, PWM controller 44 sets the conduction time duty cycle of MOSFET 40 to store energy in the primary winding of transformer 38 and then transfer the stored energy to the secondary winding during the off-time of MOSFET 40. The output voltage $V_{OUT}$ is determined by the energy transfer between the primary winding and secondary winding of transformer 38. The energy transfer is regulated by PWM controller 44 via the duty cycle of the PWM control signal to MOSFET 40. Feedback regulation loop 52 generates the feedback signal to PWM controller 44 in response to the output voltage $V_{OUT}$ to set the conduction time duty cycle of MOSFET 40.

Figure 5A:
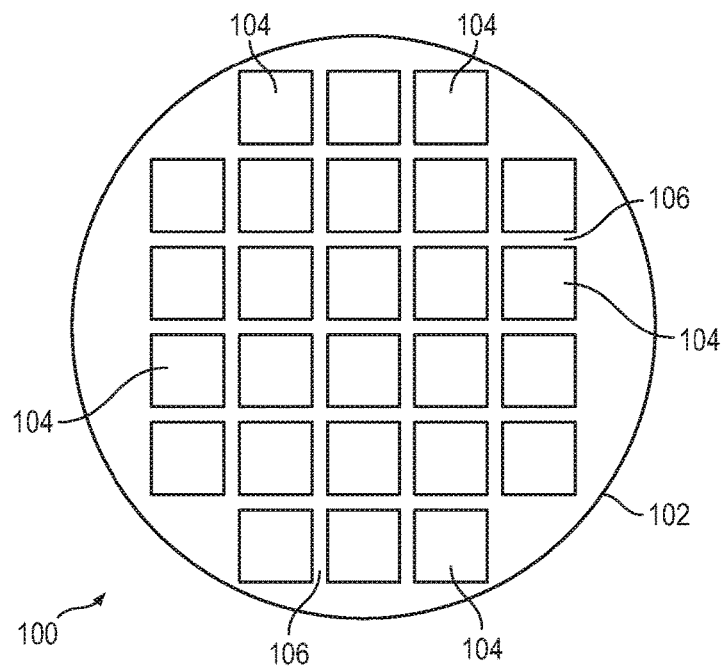
FIGS. 5a-5c illustrate a semiconductor wafer with a plurality of semiconductor die.

FIG. 5a shows semiconductor wafer or substrate 100 with a base substrate material 102, such as silicon, germanium, aluminum phosphide, aluminum arsenide, gallium arsenide, gallium nitride, indium phosphide, silicon carbide, or other bulk material for structural support. In one embodiment, substrate base material 102 includes a graphene layer or region, as described in FIGS. 6a-6r. A plurality of semiconductor die or components 104 is formed on wafer 100 separated by a non-active, inter-die wafer area or saw street 106. Saw street 106 provides cutting areas to singulate semiconductor wafer 100 into individual semiconductor die 104. In one embodiment, semiconductor wafer 100 has a width or diameter of 100-450 millimeters (mm).

Figure 5B:
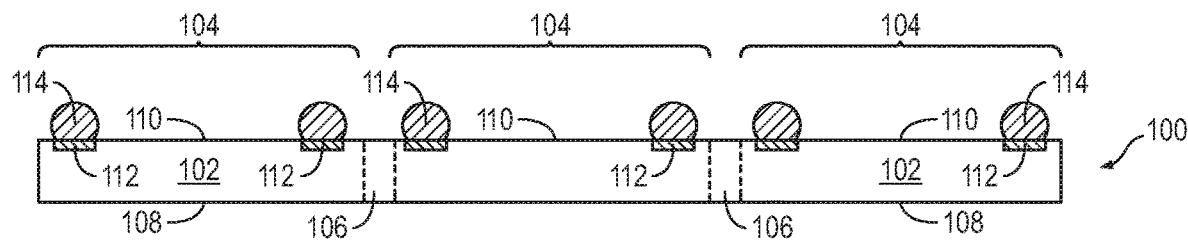

FIG. 5b shows a cross-sectional view of a portion of semiconductor wafer 100. Each semiconductor die 104 has a back or non-active surface 108 and an active surface 110 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 110 to implement analog circuits or digital circuits, such as digital signal processor (DSP), application specific integrated circuits (ASIC), memory, or other signal processing circuit. In one embodiment, semiconductor die 104 includes a multi-cell power MOSFET. Semiconductor die 104 may also contain IPDs, such as inductors, capacitors, and resistors, for RF signal processing.

An electrically conductive layer 112 is formed over active surface 110 using PVD, CVD, electrolytic plating, electroless plating process, or other suitable metal deposition process. Conductive layer 112 can be one or more layers of aluminum (Al), copper (Cu), tin (Sn), nickel (Ni), gold (Au), silver (Ag), or other suitable electrically conductive material. Conductive layer 112 operates as contact pads electrically connected to the circuits on active surface 110.

An electrically conductive bump material is deposited over conductive layer 112 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 112 using a suitable attachment or bonding process. In one embodiment, the bump material is reflowed by heating the material above its melting point to form balls or bumps 114. In one embodiment, bump 114 is formed over an under bump metallization (UBM) having a wetting layer, barrier layer, and adhesive layer. Bump 114 can also be compression bonded or thermocompression bonded to conductive layer 112. Bump 114 represents one type of interconnect structure that can be formed over conductive layer 112. The interconnect structure can also use bond wires, conductive paste, stud bump, micro bump, or other electrical interconnect.

Figure 5C:
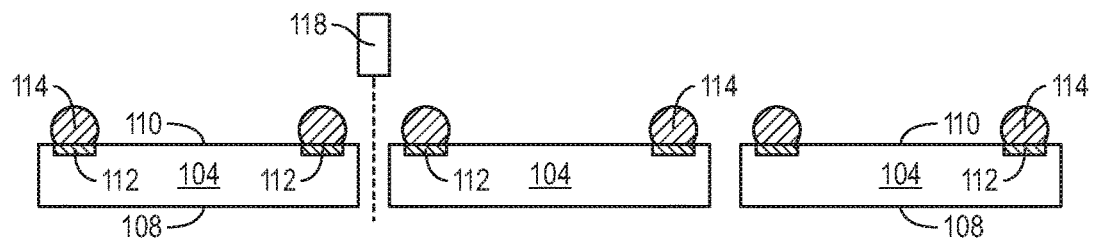

In FIG. 5c, semiconductor wafer 100 is singulated through saw street 106 using a saw blade or laser cutting tool 118 into individual semiconductor die 104. The individual semiconductor die 104 can be inspected and electrically tested for identification of KGD post singulation. In one embodiment, semiconductor die 104 contains a multi-cell power MOSFET having applications in DC-DC power converters, data processing centers, and general purpose portable electronic devices. The MOSFET cells are electrically connected in parallel to form a power MOSFET for high current carrying capacity. The low voltage characteristic of the power MOSFET is particularly useful in power supply 30 requiring say a 3.3 volt rated power MOSFET in order to generate a 0.7 VDC operating potential for electronic equipment 32.

Figure 6A:
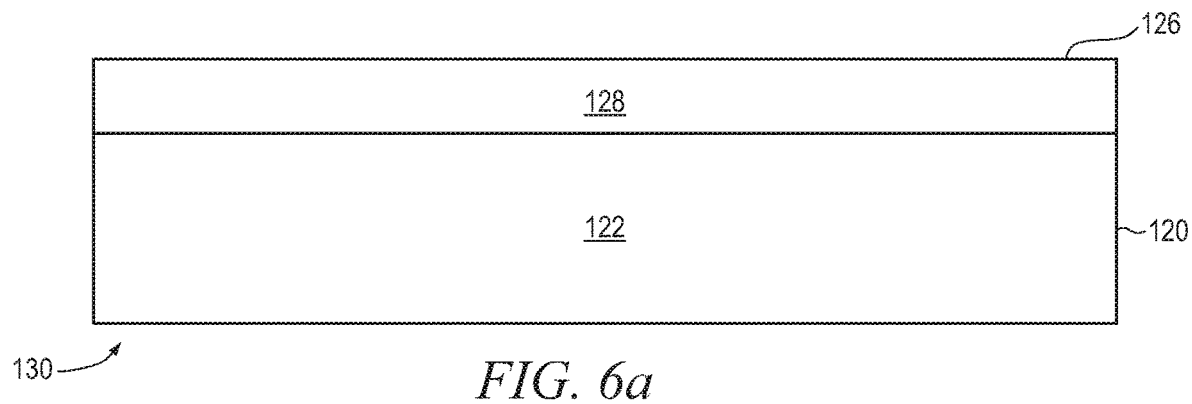
FIGS. 6a-6r illustrate a process of forming a low voltage MOSFET cell with graphene on the SI, GaN, SiC, or diamond substrate.

FIG. 6a illustrates substrate 120 containing a base semiconductor material 122, such as silicon, silicon carbide (SiC), gallium arsenide, gallium nitride (GaN), germanium, indium phosphide, or diamond for structural support. A screen oxidation layer can be formed on surface 126 prior to implantation. For N-MOS devices, substrate 120 is initially doped with p-type semiconductor material, such as boron, aluminum, or gallium impurities, to form retrograde p-well region 128 to a depth of 300 nanometers (nm) below surface 126 of the substrate. The p-type dopant is deposited by ion implantation with dosage of 1E13 to 1E14 at hundreds of keV. Other implants can be deposited at appropriate dosages and energy levels. No mask is needed for the ion implantation. The retrograde p-well region 128 reduces punch through effect, serves to clamp the drain-to-source breakdown voltage ($BV_{DSS}$), decreases reverse recovery time, and generally improves robustness of the to-be formed MOSFET cell 130.

MOSFET cell 130 can be an n-channel lateral device (N-MOS) or a p-channel lateral device (P-MOS), where "p" denotes a positive carrier type (hole) and "n" denotes a negative carrier type (electron). Although the present embodiment is described in terms of an N-MOS device, the opposite type semiconductor material can be used to form a P-MOS device. For example, an n-type substrate can be initially doped with n-type semiconductor material, such as phosphorus, antimony, or arsenic impurities, to form a retrograde n-well region.

Figure 6B:
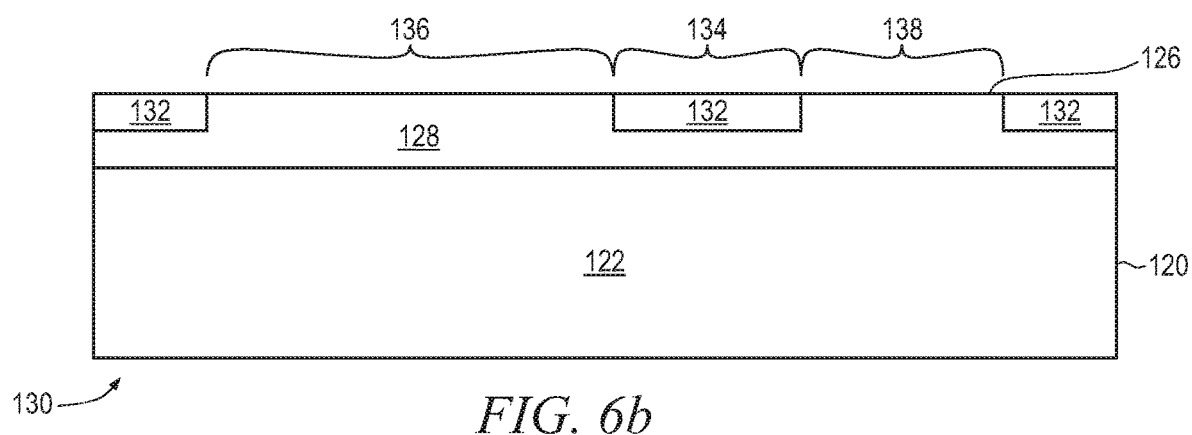
Figure 6C:
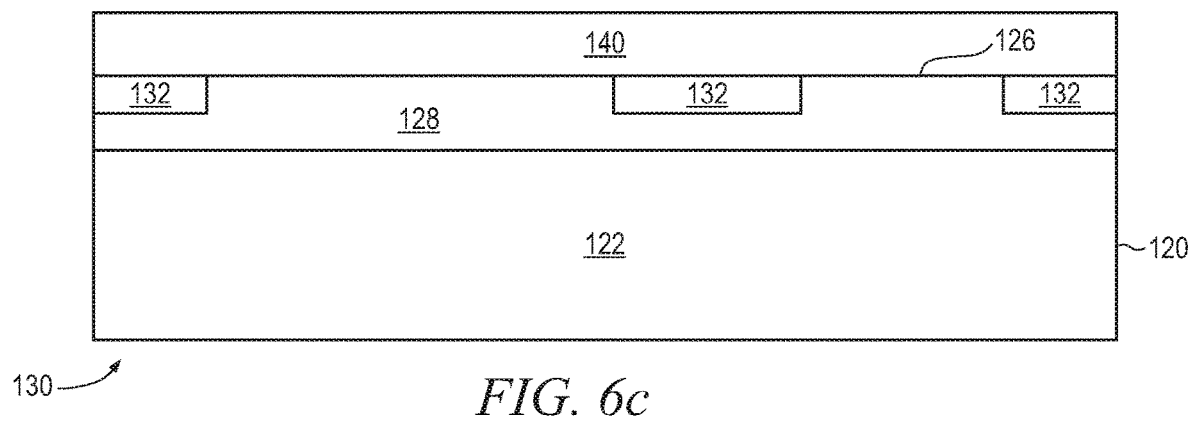

In FIG. 6b, graphene layer or region 132 is formed on surface 126 or within substrate 120, e.g., using liquid-phase-epitaxy growth of graphene with semiconducting properties or diamond enabled by a catalytic alloy of Ni and Cu. In particular, graphene with semiconducting properties or diamond region 132 is formed under the to-be-formed gate region 134 between the to-be-formed source region 136 and the to-be-formed drain region 138. Silicon layer 140 is then epitaxially grown on surface 126 of substrate 120 to form structures of MOSFET cell 130, as shown in FIG. 6c.

Figure 6D:
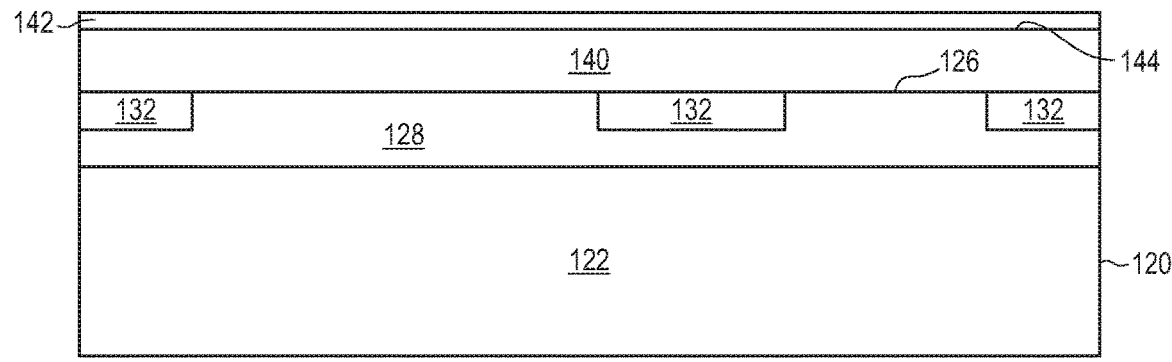

In FIG. 6d, a second implant of p-type semiconductor material into layer 140 to form voltage threshold ($V_{TH}$) adjust region 142 on surface 144 of the substrate. The p-type dopant is deposited by ion implantation with dosage of 1E12 at tens of keV. No mask is needed for the ion implantation. The $V_{TH}$ adjust region 142 can be tuned by dopant levels to control $V_{TH}$ and reduce punch through effects.

Figure 6E:
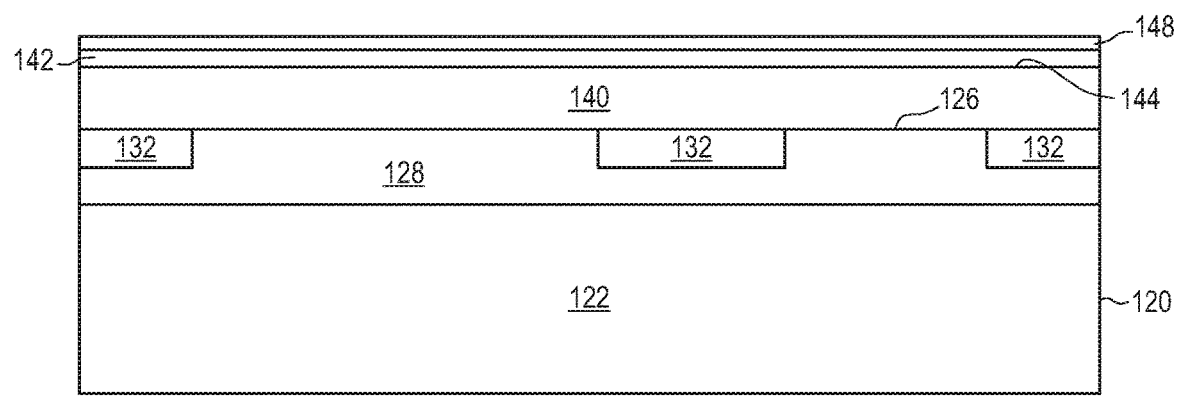

In FIG. 6e, an insulating or dielectric layer 148 is formed over layer 140 as a gate oxide layer. The insulating layer 148 contains one or more layers of silicon dioxide (SiO2), silicon nitride (Si3N4), silicon oxynitride (SiON), tantalum pentoxide (Ta2O5), aluminum oxide (Al2O3), polyimide, benzocyclobutene (BCB), polybenzoxazoles (PBO), or other suitable dielectric material. The insulating layer 148 is formed using PVD, CVD, screen printing, spin coating, spray coating, sintering, or thermal oxidation. In one embodiment, gate oxide layer 148 is 9.0-12.0 nanometers (nm) in thickness. The thickness of gate oxide layer 148 controls $V_{TH}$, hot carrier injection (HCI), $BV_{DSS}$, and gate-source voltage ($V_{GS}$) rating.

Figure 6F:
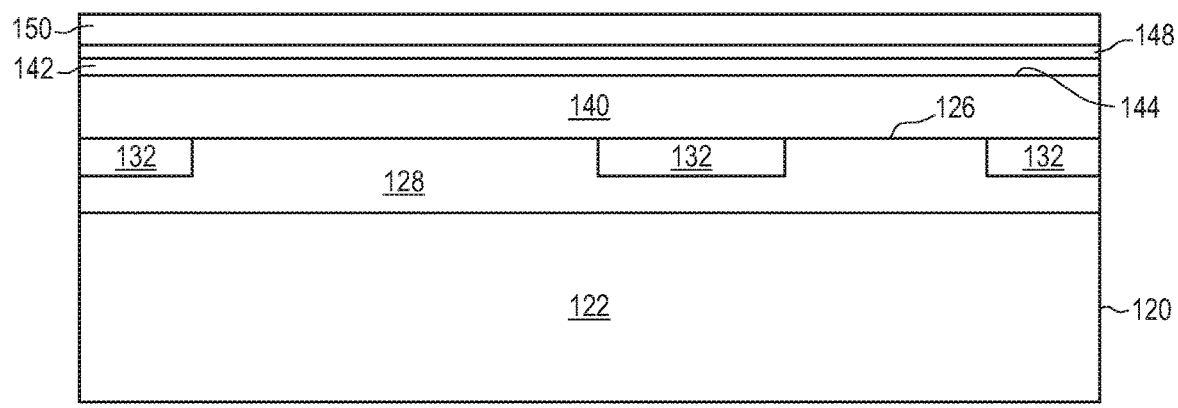
Figure 6G:
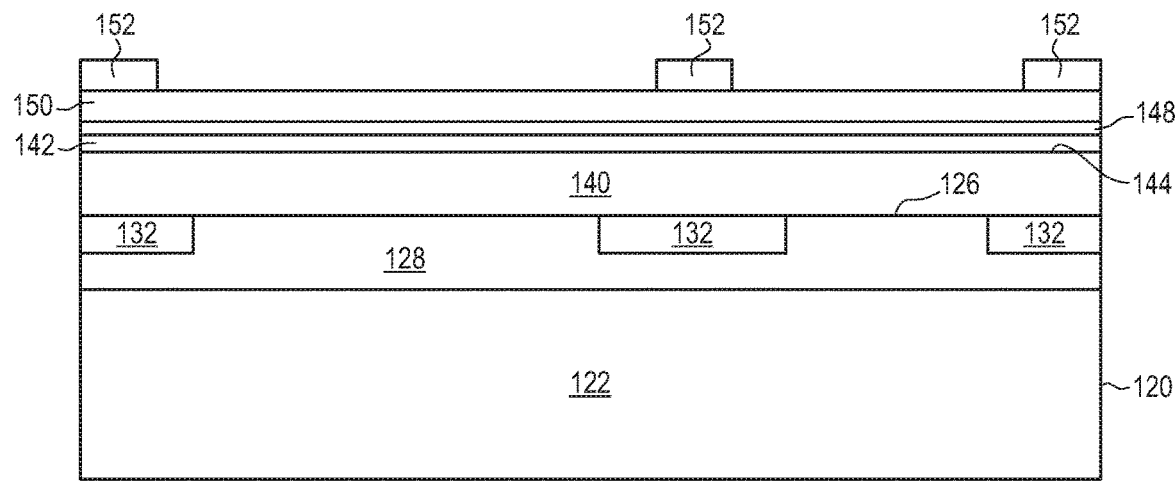
Figure 6H:
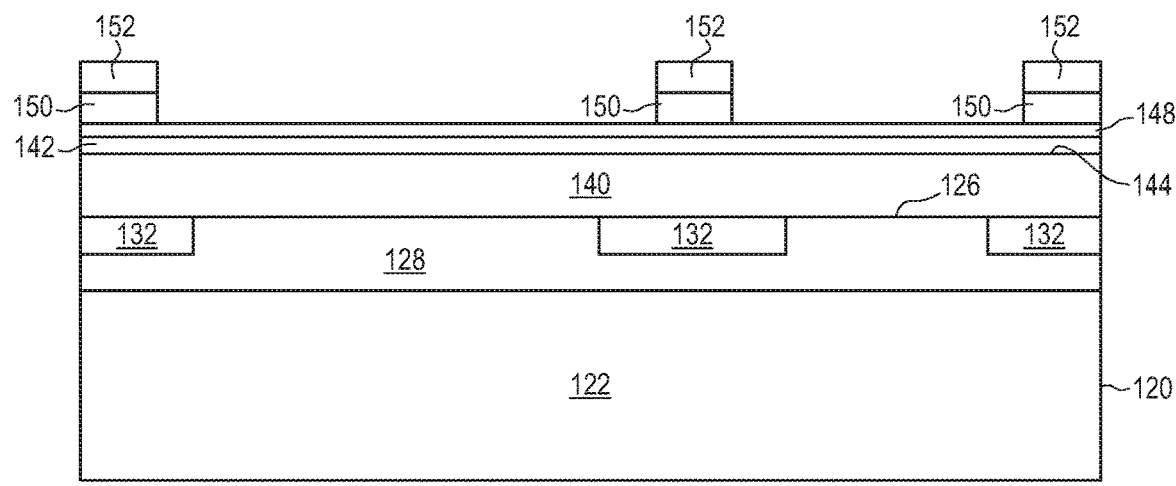

In FIG. 6f, polysilicon layer 150 is formed over insulating layer 148 to a thickness of 0.20-0.35 µm. The resistance of polysilicon layer 150 can be reduced by heavy doping with n-type semiconductor material, such as arsenic. A photoresist layer 152 is formed over polysilicon layer 150, as shown in FIG. 6g. A portion of photoresist layer 152 is removed by an etching process corresponding to placement of the gate pattern. The portion of polysilicon layer 150 outside photoresist layer 152 is removed by an etching process, as shown in FIG. 6h.

Figure 6I:
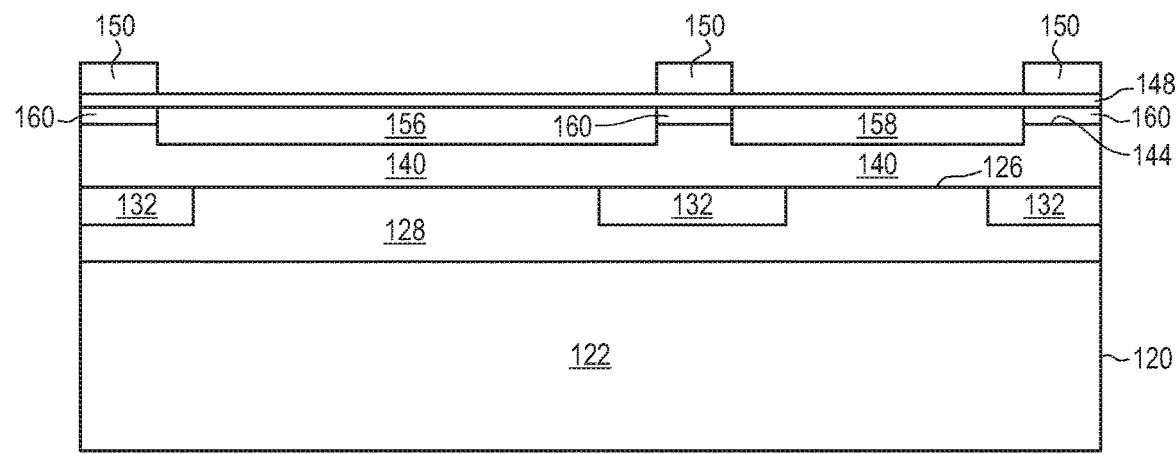

In FIG. 6i, photoresist layer 152 is removed. Layer 140 is doped with n-type semiconductor material, such as arsenic, to a depth of 20 nm below surface 86 of the substrate to form lightly doped drain (LDD) regions 156 and 158. The n-type dopant is deposited by ion implantation with dosage of 1E13 to 1E14 at 10-50 keV. Other implants can be deposited at appropriate dosages and energy levels. The LDD regions 156 and 158 can be tuned by dopant levels to reduce punch through effects and control HCI and $BV_{DSS}$. The area between LDD regions 156 and 158 is designated as n-channel 160.

Figure 6J:
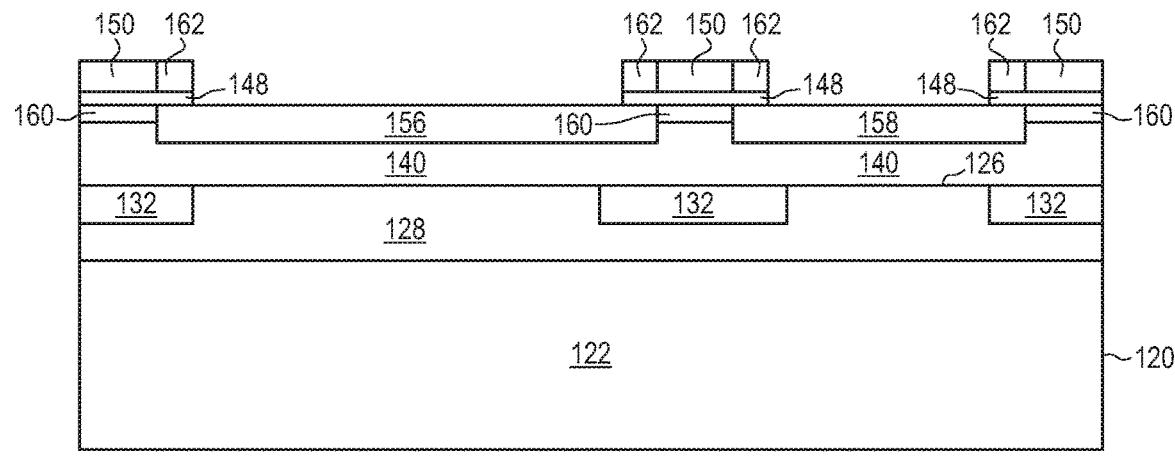

In FIG. 6j, an insulating layer 162 is formed around polysilicon layer 150 over insulating layer 148. The insulating layer 162 contains one or more layers of SiO2, Si3N4, SiON, Ta2O5, Al2O3, polyimide, BCB, PBO, or other suitable dielectric material. The insulating layer 162 is formed using PVD, CVD, screen printing, spin coating, spray coating, sintering, or thermal oxidation. A portion of insulating layer 148 over LDD regions 156 and 158 is removed by an etching process using polysilicon layer 150 and insulating layer 162 as the mask. The remaining portion of insulating layer 148 extends about 150-200 nm beyond polysilicon layer 150 over LDD regions 156 and 158. The insulating layer 162 also operates as a sidewall spacer to mask subsequent drain and source ion implants.

Figure 6K:
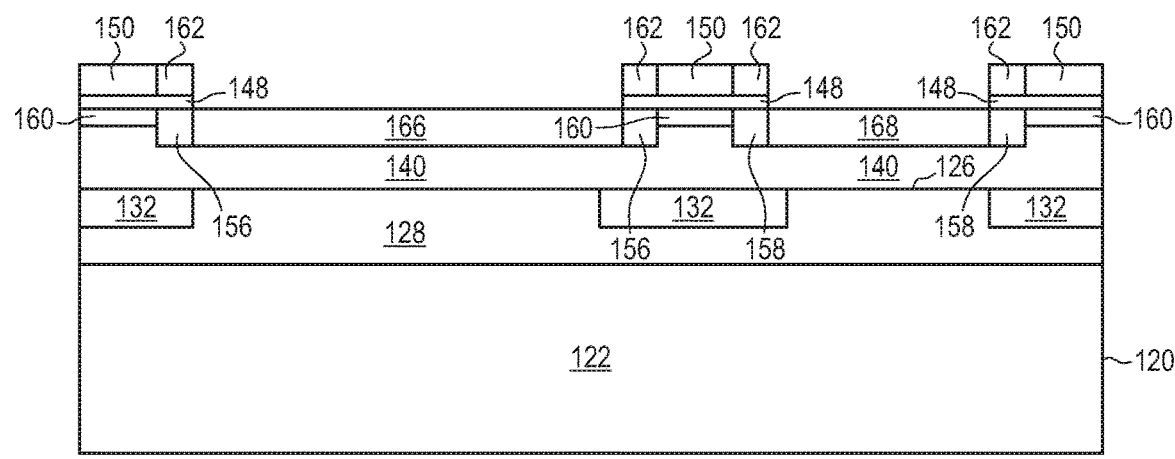

In FIG. 6k, the portion of LDD regions 156 and 158 outside the mask are heavily doped with n-type semiconductor material, such as arsenic, to form N+ source region 166 and N+ drain region 168. The n-type dopant is deposited by ion implantation with dosage of 3E15 at 10-50 KeV using polysilicon layer 150 and insulating layer 162 as the mask. The N+ source region 166 and N+ drain region 168 have a low resistance ohmic contact for MOSFET cell 130.

Figure 6L:
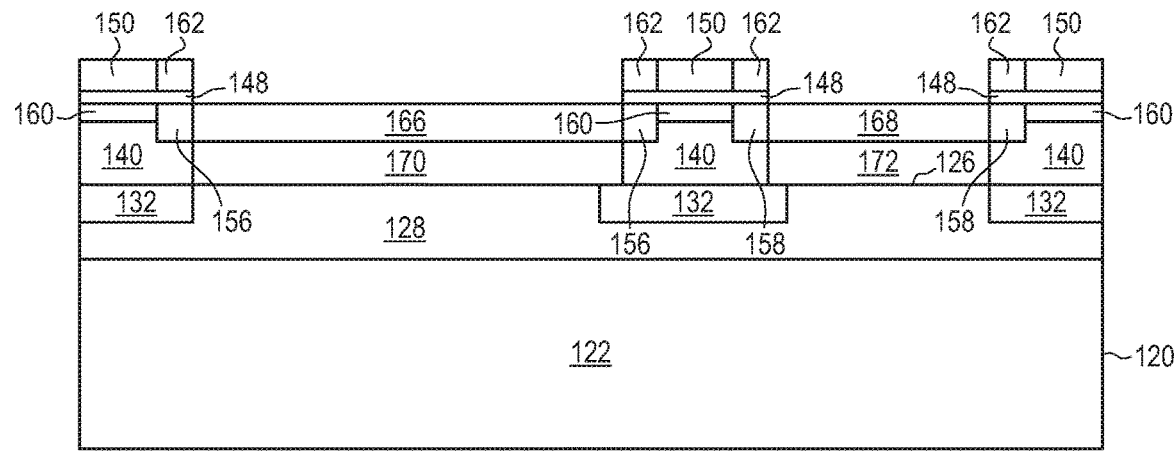

In FIG. 6l, the portion of layer 140 directly below N+ source region 166 and N+ drain region 168 and outside the mask is co-implanted with p-type semiconductor material, such as boron, to a depth of 350 nm below surface 144 of the substrate to form P+ clamping regions 170 and 172. The p-type dopant is deposited by ion implantation with dosage of 1E14 at 100 keV using polysilicon layer 150 and insulating layer 162 as the mask. The co-implant P+ clamping regions 170 and 172 and N+ regions 166 and 168, respectively, operate as Zener diodes to reduce HCI, clamp $BV_{DSS}$ to 5-6 volts, and improve robustness of MOSFET cell 130. P+ clamping regions 170 and 172 enhance avalanche energy capability of MOSFET cell 130.

Figure 6M:
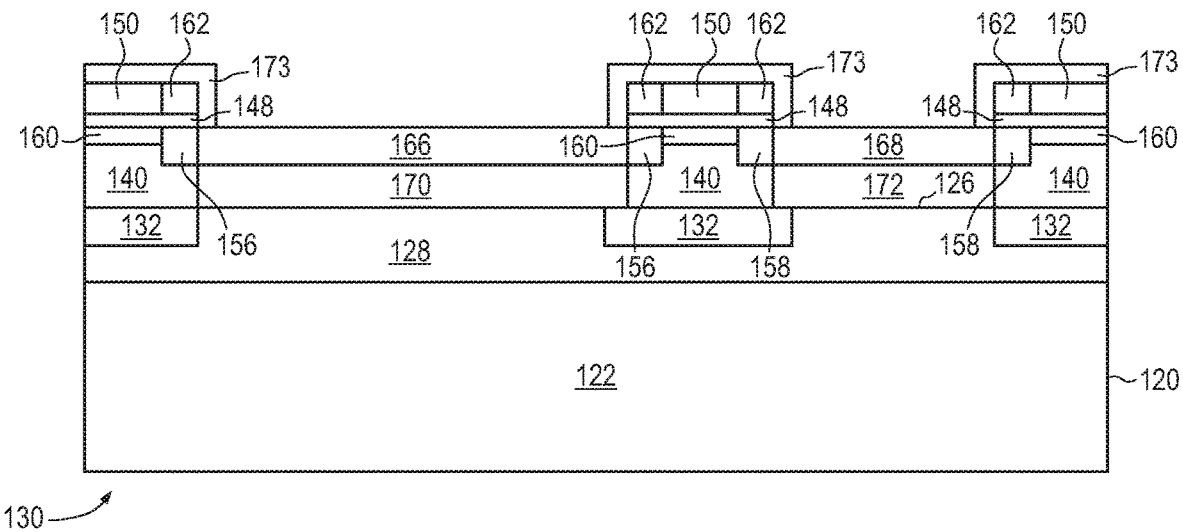

FIG. 6m shows an alternate embodiment with photoresist layer 173 formed over polysilicon layer 150 and insulating layers 148 and 162, including the side walls of the insulating layers. The portion of layer 140 directly below N+ source region 166 and N+ drain region 168 and outside the mask is implanted with p-type semiconductor material, such as boron, to a depth of 350 nm below surface 144 of the substrate to form P+ clamping regions 170 and 172. The p-type dopant is deposited by ion implantation with dosage of 1E14 at 100 keV using photoresist layer 173 as the mask. The implant P+ clamping regions 170 and 172 and N+ regions 166 and 168, respectively, operate as Zener diodes to reduce HCI, clamp $BV_{DSS}$ to 5-6 volts, and improve robustness of MOSFET cell 130.

Figure 6N:
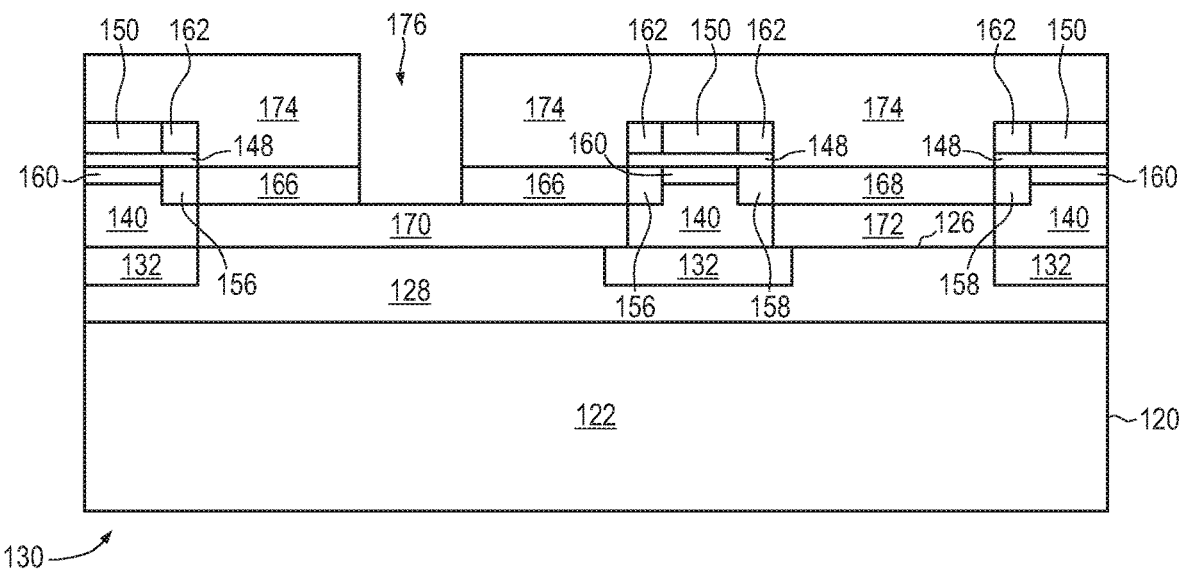

In FIG. 6n, photoresist layer 174 is formed over N+ source region 166, N+ drain region 168, polysilicon layer 150, and insulating layer 162. A portion of photoresist layer 174 over N+ source region 166 is removed by an etching process to expose a portion of the N+ source region. The exposed portion of N+ source region 166 is removed by the etching process to form source trench 176. The source trench 176 is a continuous stripe along the width W of MOSFET cell 130. The source trench 176 has a width of 0.35 µm and depth of 0.15-0.20 µm.

Figure 6O:
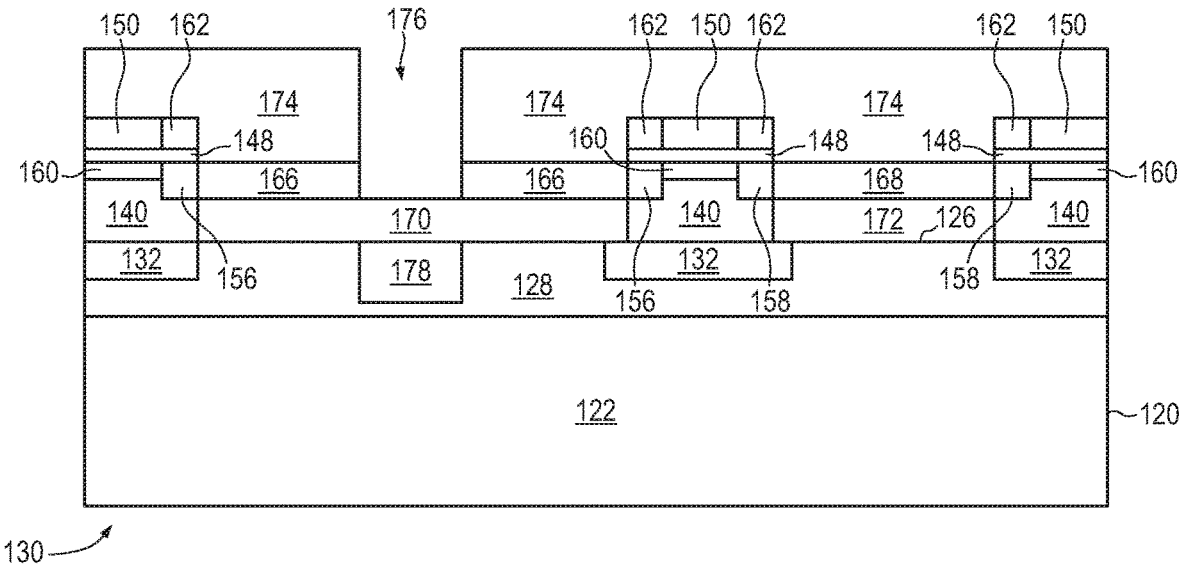

In FIG. 6o, a P+ plug 178 is formed through source trench 166 by implanting p-type semiconductor material, such as boron, to a depth of 0.3-0.4 The p-type dopant is deposited by ion implantation with dosage of 1E14 at 50-100 keV using photoresist layer 174 as the mask. The P+ plug 178 improves robustness of MOSFET cell 130 by reducing parasitic base resistance.

Figure 6P:
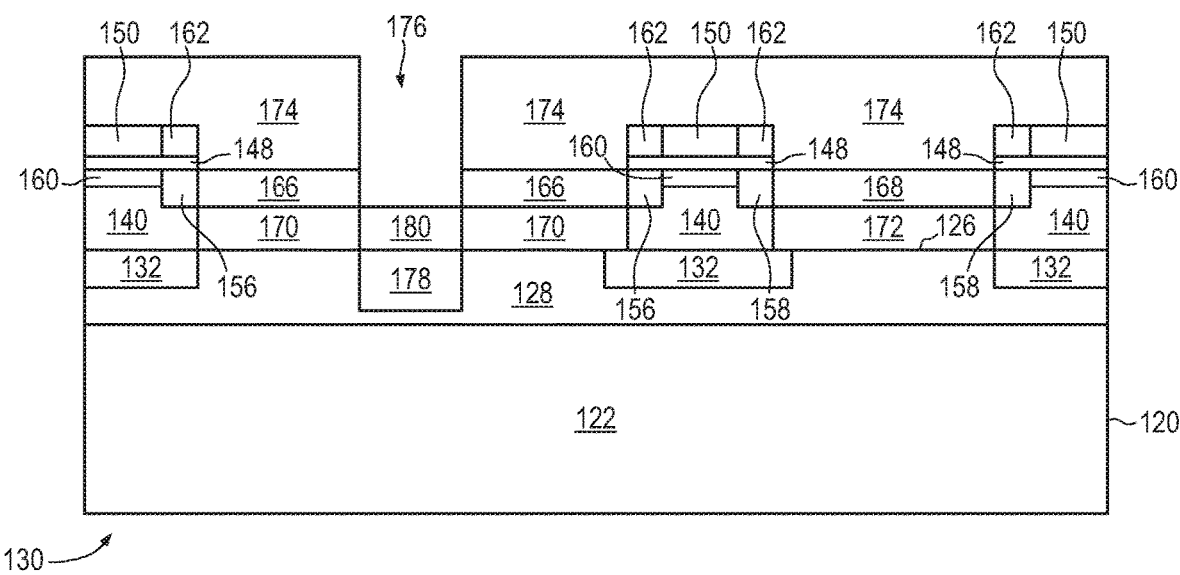

In FIG. 6p, a P+ source tie 180 is formed through source trench 166 over P+ plug 178 by implanting p-type semiconductor material, such as BF2 or boron. The p-type dopant is deposited by ion implantation with dosage of 1E15 at 20 keV using photoresist layer 174 as the mask. The source trench 166 allows the cell pitch to be reduced while maintaining continuous low resistance contact to P+ source tie 180. The P+ source tie 180 improves robustness of MOSFET cell 130 by reducing parasitic base resistance.

Figure 6Q:
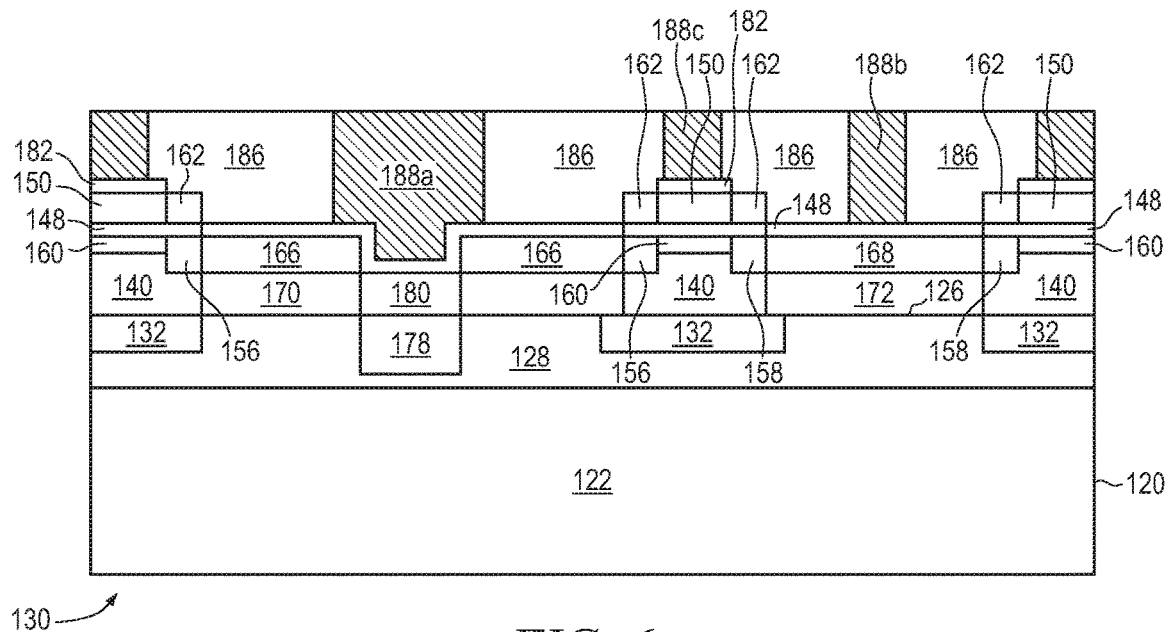

In FIG. 6q, photoresist layer 174 is removed, followed by rapid thermal anneal or 900° C. 20 min furnace anneal to activate dopants in MOSFET cell 130. Silicide layer 182 is formed over N+ source region 166 and N+ drain region 168 and polysilicon layer 150. Silicide layer 182 extends into source trench 176, following the contour of source trench 176, N+ source region 166, and P+ source tie 180. In one embodiment, a titanium silicide is used for enhanced narrow line poly sheet resistance. Silicide layer 182 is a low resistance layer to reduce parasitic interconnect resistance. An insulating layer or interlayer dielectric (ILD) 186 formed over silicide layer 182. The ILD 186 contains one or more layers of SiO2, Si3N4, SiON, Ta2O5, Al2O3, polyimide, BCB, PBO, or other suitable dielectric material. The ILD 186 is formed using PVD, CVD, screen printing, spin coating, spray coating, sintering, or thermal oxidation. A portion of ILD 186 is removed by an etching process to expose silicide layer 182 over P+ source tie 180 and a portion of N+ source region 166, polysilicon layer 150, and N+ drain region 168. Conductive layer 188 is formed over the exposed portions of silicide layer 182. In particular, conductive layer 188a is formed over N+ source region 166 and into source trench 176 to P+ source tie 180 as a source contact or terminal, conductive layer 188b is formed over N+ drain region 168 as a drain contact or terminal, and conductive layer 188c is formed over polysilicon layer 150 as a gate contact or terminal. Conductive layer 188 can be one or more layers of tungsten (W), aluminum (Al), copper (Cu), tin (Sn), nickel (Ni), gold (Au), silver (Ag), or other suitable electrically conductive material formed using patterning with PVD, CVD, sputtering, electrolytic plating, electroless plating process, or other suitable metal deposition process. In one embodiment, the thickness of conductive layer 188 is about 2.0 µm.

Figure 6R:
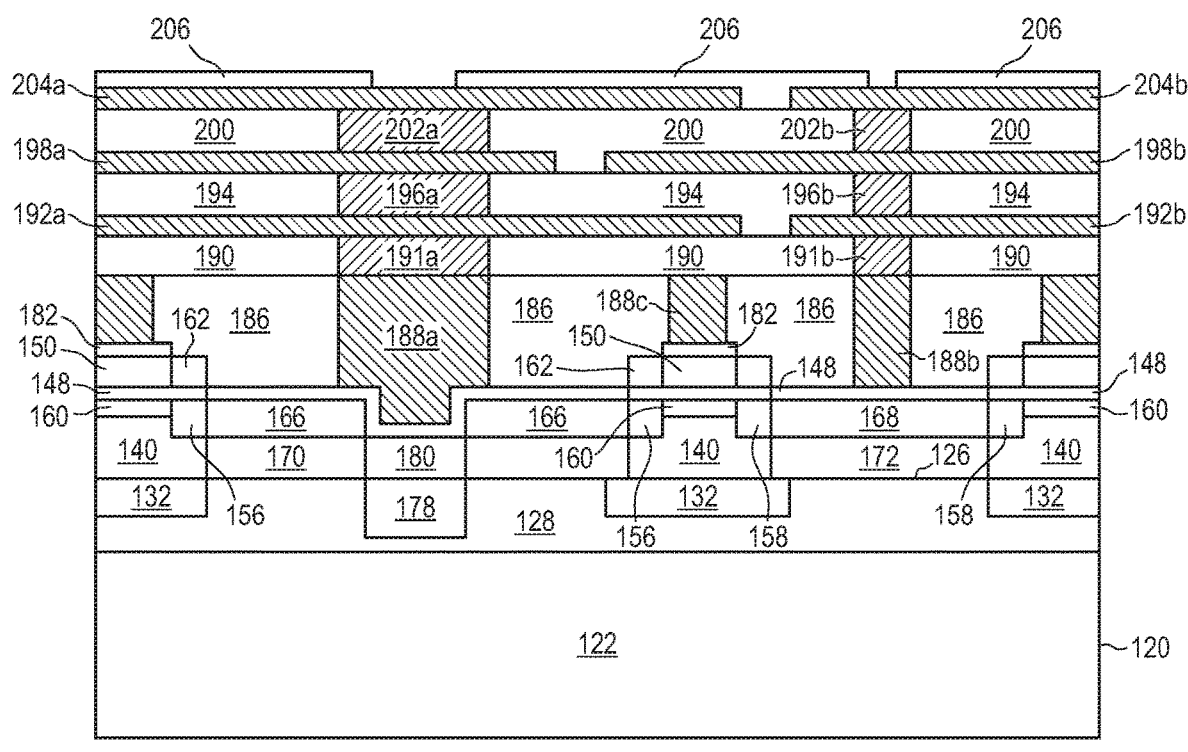

FIG. 6r shows additional interconnect layers formed over MOSFET cell 130. An insulating layer or passivation layer 190 is formed over ILD 186 and conductive layer 188 for electrical isolation. The insulating layer 190 contains one or more layers of SiO2, Si3N4, SiON, Ta2O5, Al2O3, or other suitable material having insulating and structural properties. In one embodiment, the ILD thickness for a 0.30 µm contact is about 0.75 to 0.90 µm. The insulating layer 190 is formed using PVD, CVD, screen printing, spin coating, spray coating, sintering, or thermal oxidation. A portion of insulating layer 190 is removed by an etching process to expose conductive layer 188a and 188b. Conductive layer 191 is formed over conductive layer 188a and 188b. Conductive layer 192 is formed over conductive layer 191a and 191b and insulating layer 190. Conductive layers 191 and 192 can be one or more layers of W, Al, Cu, Sn, Ni, Au, Ag, or other suitable electrically conductive material formed using patterning with PVD, CVD, sputtering, electrolytic plating, electroless plating process, or other suitable metal deposition process. Conductive layer 192a is electrically connected to conductive layer 191a, and conductive layer 192b is electrically connected to conductive layer 191b. Conductive layer 192a-192b can be electrically isolated or electrically common depending on the design and function of MOSFET cell 130. Conductive layers 188, 191, and 192 represent a first level interconnect layer.

An insulating layer or passivation layer 194 is formed over conductive layer 192. The insulating layer 194 contains one or more layers of SiO2, Si3N4, SiON, Ta2O5, Al2O3, or other suitable material having insulating and structural properties. The insulating layer 194 is formed using PVD, CVD, screen printing, spin coating, spray coating, sintering, or thermal oxidation. In one embodiment, the ILD thickness for a 0.30 µm contact is about 0.75 to 0.90 µm. A portion of insulating layer 194 is removed by an etching process to expose conductive layer 192a and 192b. Conductive layer 196 is formed over conductive layer 192a and 192b. Conductive layer 198 is formed over conductive layer 196a and 196b and insulating layer 194. Conductive layers 196 and 198 can be one or more layers of W, Al, Cu, Sn, Ni, Au, Ag, or other suitable electrically conductive material formed using patterning with PVD, CVD, sputtering, electrolytic plating, electroless plating process, or other suitable metal deposition process. In one embodiment, the thickness of conductive layers 191-198 is about 2.0 µm. Conductive layers 196a and 198a are electrically connected to conductive layer 192a, and conductive layer 196b and 198b is electrically connected to conductive layer 192b. Conductive layer 198 can be electrically isolated or electrically common depending on the design and function of MOSFET cell 130. Conductive layers 196-198 represent a second level interconnect layer.

An insulating layer or passivation layer 200 is formed over conductive layer 198. The insulating layer 200 contains one or more layers of SiO2, Si3N4, SiON, Ta2O5, Al2O3, or other suitable material having insulating and structural properties. The insulating layer 200 is formed using PVD, CVD, screen printing, spin coating, spray coating, sintering, or thermal oxidation. In one embodiment, the ILD thickness for a 0.30 µm contact is about 0.75 to 0.90 µm. A portion of insulating layer 200 is removed by an etching process to expose conductive layer 198a and 198b. Conductive layer 202 is formed over conductive layer 198a and 198b. Conductive layer 204 is formed over conductive layer 202a and 202b and insulating layer 200. Conductive layers 202 and 204 can be one or more layers of W, Al, Cu, Sn, Ni, Au, Ag, or other suitable electrically conductive material formed using patterning with PVD, CVD, sputtering, electrolytic plating, electroless plating process, or other suitable metal deposition process. In one embodiment, the thickness of conductive layers 202-204 is about 2.0 µm. Conductive layer 202a and 204a is electrically connected to conductive layer 198a, and conductive layer 202b and 204b is electrically connected to conductive layer 198b. Conductive layer 204 can be electrically isolated or electrically common depending on the design and function of MOSFET cell 130. Conductive layers 202-204 represent a third level interconnect layer.

An insulating layer or passivation layer 206 is formed over conductive layer 204. The insulating layer 206 contains one or more layers of SiO2, Si3N4, SiON, Ta2O5, Al2O3, or other suitable material having insulating and structural properties. The insulating layer 206 is formed using PVD, CVD, screen printing, spin coating, spray coating, sintering, or thermal oxidation. A portion of insulating layer 206 is removed by an etching process to expose conductive layer 204a and 204b for additional electrical interconnect. The first, second, and third level interconnect layers provide common connections to each N+ source region 166, common connections to each N+ drain region 168, and common connections to each gate structure 150 for a plurality of MOSFET cells 130. The first, second, and third level interconnect layers also provide connections to external terminals of the semiconductor package containing MOSFET cell 130. Other electric devices can be formed over substrate 120 to realize analog or digital circuit functions.

Figure 7:
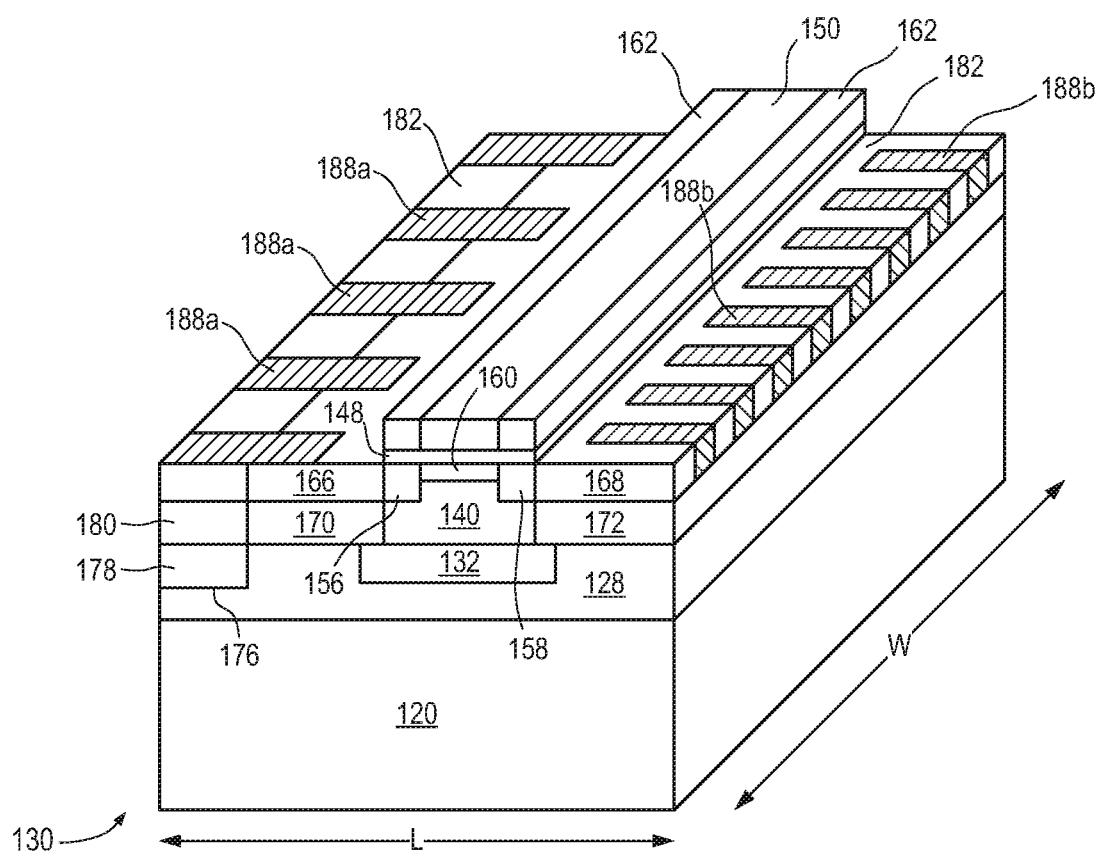
FIG. 7 illustrates an orthogonal view of the low voltage MOSFET cell with graphene SI, GaN, SiC, or diamond on the substrate.

FIG. 7 illustrates a prospective view of MOSFET cell 130 having length L and width W. The retrograde p-well region 128 is formed within substrate 120. Graphene with semi-conducting properties or diamond region 132 is formed on or within p-well region 128 below gate region 134 in the lateral MOSFET structure. N+ source region 166 and N+ drain region 168 are formed over co-implant P+ clamping regions 170 and 172. Gate structure 148-150 is formed over n-channel 160 separating N+ source region 166 and LDD region 156 from N+ drain region 168 and LDD region 158. The insulating sidewall spacers 162 are formed around gate structure 148-150. The source trench 176 formed through N+ source region 166 allows formation of P+ plug 178 and P+ source tie 180. Conductive layer 188a is formed over N+ source region 166 and into the source trench to electrically connect to N+ source region 166, P+ source tie 190, and P+ plug 178. As seen in FIG. 7, an insulating layer 182 is also formed in the source trench between conductive layer 188a.

Conductive layer 188b is formed over N+ drain region 168 to electrically connect to the N+ drain region.

Graphene with semiconducting properties or diamond region 132 can also be used in the voltage range from 3.0-12.0 volts for MOSFETs, IGBT (Insulated Gate Bipolar Transistors), CTIGBT (Cluster Trench Insulated Gate Bipolar Transistors and other MOS gated devices. Among the disruptive actions that will accelerate major advances in Aerospace satellite reconnaissance capabilities is the employment of high voltage power systems on spacecraft. Increasing power supply voltage on satellites leads directly to broader coverage and faster orbital positioning. Operation at high voltage (300 to 600 V) also allows designers to eliminate power conversion components, which would significantly reduce spacecraft volume and weight. However, such power systems require innovative solutions for increasing operational lifetime, radiation tolerance, and reliability in the extreme space environment.

Given the critical role of the power MOSFET, in Aerospace applications, the graphene with semiconducting properties or diamond enhancement layer design lends itself to radiation hardened high voltage (>150V) and low voltage Si or GaN or SiC power MOSFET based on the standard Superjunction MOSFET (SJMOS) and MEMS Superjunction (MEMS SJMOS) VERTICAL FET technology, as well as Lateral MOSFET technology.

Figure 8:
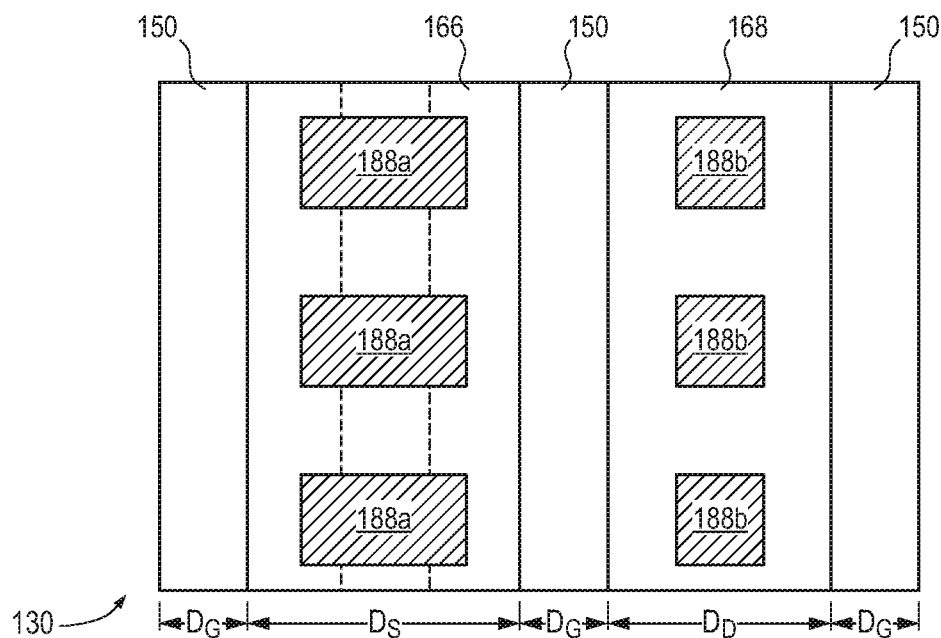
FIG. 8 illustrates a top view of the low voltage MOSFET cell.

FIG. 8 shows a top view of MOSFET cell 130 with source trench 176 in a straight configuration. In one embodiment, the width $D_G$ of polysilicon layer 150 is 0.20 μm. The width $D_S$ of N+ source region 166 is 1.14-1.19 μm. The width $D_D$ of N+ drain region 168 is 0.74-0.79 μm. In other embodiments, the width $D_S$ of N+ source region 166 can be as small as 0.50 μm. Source trench 176 reduces the N+ source region width $D_S$ and accordingly the MOSFET cell pitch to about 1.14 μm. The smaller cell pitch reduces $R_{DSON}$ to the range of hundreds of microohms for MOSFET cell 130. Source trench 176 can also be arranged in a serpentine, sawtooth, or discrete offset sectional configuration.

Figure 9:
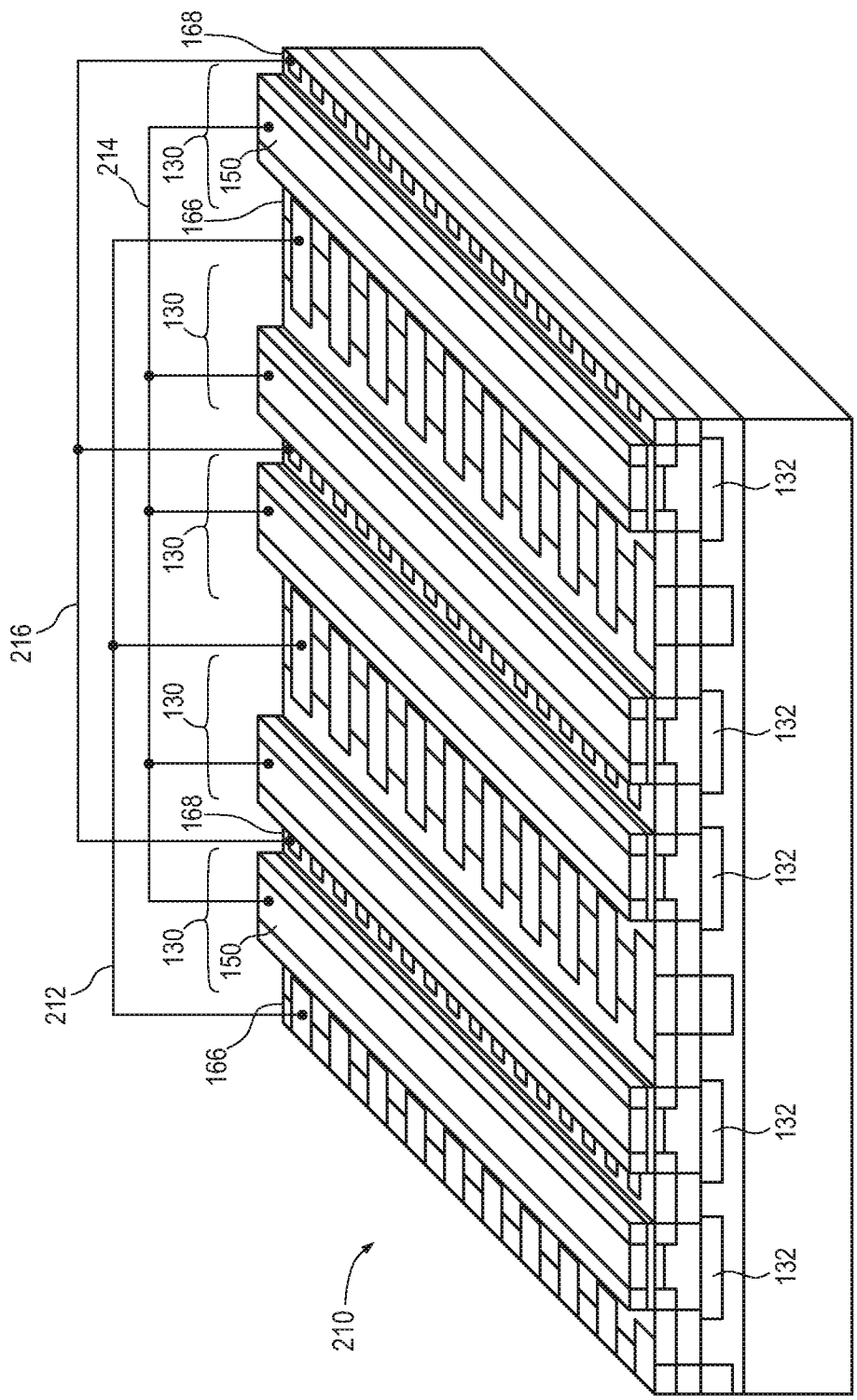
FIG. 9 illustrates a plurality of low voltage MOSFET cells electrically connected in parallel to form a power MOSFET.

FIG. 9 shows a striped array of MOSFET cells 130, potentially hundreds or thousands of cells, electrically connected in parallel to form power MOSFET 210, as a type of semiconductor component or element. N+ source regions 166 are commonly connected with conductive trace 212, polysilicon layers 150 are commonly connected with conductive trace 214, and N+ drain regions 168 are commonly connected with conductive trace 216. Power MOSFET 210 operates as a single monolithic switching device capable of handling many amperes of electrical current. The routing of conductive interconnects 212-216 minimizes parasitic resistance and inductance across power MOSFET 160.

Power MOSFET 210 is designed for low voltage, e.g., 3.3 VDC, and low $R_{DSON}$ applications, such as DC to DC converters, datacenters, and high performance computing. In particular, graphene with semiconducting properties or diamond region 132 on silicon substrate 120 possesses a variety of exceptional functionalities ranging from electronics, optics/photonics, electrochemical and biocompatibility properties, which could complement silicon, GaN, and SiC. Graphene with semiconducting properties or diamond 132 can be formed over large areas or selective sites. The graphene with semiconducting properties or diamond enhanced substrate 120 provides radiation hardening and should achieve total ionizing dose (TID) of greater than 300 krads. Graphene with semiconducting properties or diamond region 132 provides a high electron mobility transport properties of epitaxial graphene on 3C-SiC to be applied over large areas. For example, in a 200 nm CMOS process scaled to large area, lateral power MOSFET 210 formed on the graphene with semiconducting properties or diamond enhanced substrate achieves high electron mobility. The graphene with semiconducting properties or diamond region 132 has an electron mobility 1000 times higher than silicon. With the ability to apply graphene with semiconducting properties or diamond to SiC, GaN, silicon, many device structures that can benefit from a large area graphene liquid-phase-growth platform.

Another goal of low voltage MOSFET 210 is to provide low $R_{DSON}$ and low $BV_{DSS}$. Graphene with semiconducting properties or diamond region 132 on substrate 120 reduces $R_{DSON}$ by a factor of 50-200%. In power MOSFETs, the possibility of avalanche breakdown causes reliability and performance issues. For low voltage applications, e.g., 3.3 VDC, the externally applied drain-to-source voltage may exceed the $BV_{DSS}$ of MOSFET cell 130, potentially placing the device into avalanche. Normally, surface avalanche occurs in the region between the drain region and gate oxide. Hot carriers are injected into the gate oxide which leads to long-term degradation of device parametrics. In addition, high voltage and high current simultaneously exist causing excessive heat generation. The inherent parasitic N-P-N bipolar transistor within the MOSFET can be activated, in a condition known as snapback, wherein that minority carriers generated by avalanche between the gate oxide and drain region have to travel only a short distance to reach the N+ source (emitter of the parasitic NPN). The effective NPN base length ($L_B$) becomes quite small, leading to possible snapback condition and long term degradation of the device. In MOSFET cell 130, if avalanche breakdown does occur, P+ clamping regions 170 and 172 limit the effect to an area well below surface 126, i.e., to the p-n junction formed by the P+ clamping region and N+ source region 166 and N+ drain region 168. By forcing the avalanche carriers to be generated further from the emitter, the effective $L_B$ is increased, and the device can safely handle higher levels of avalanche current. The base doping concentration in the clamp diode is made as high as possible, which creates a higher rate of minority carrier recombination in the base. In one embodiment, the clamp diode implant can be accomplished as a co-implant with the self-aligned N+ source/drain implant, as shown in FIG. 6l, or by utilizing the retrograde p-well implant, or combination of both. The layout features of MOSFET cells 130, namely smaller width N+ source region 166 due to source trench 176, provide for reduced cell pitch and lower $R_{DSON}$ and $BV_{DSS}$.

Figure 10A:
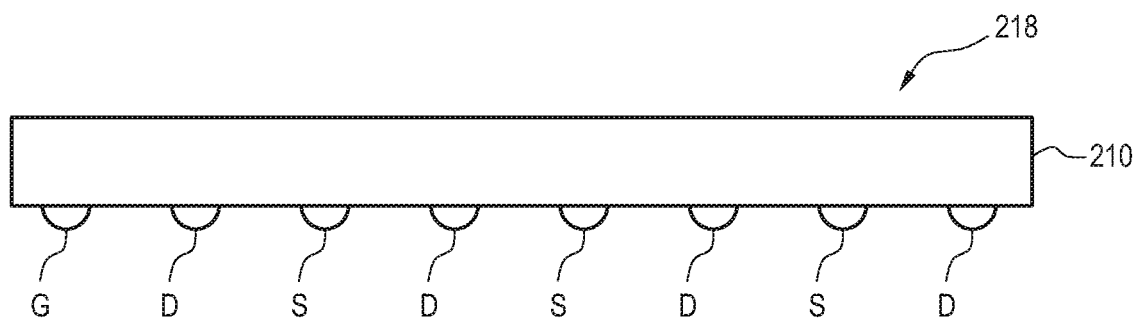
FIGS. 10a-10b illustrate the external electrical interconnect for the power MOSFET in a BGA package.
Figure 10B:
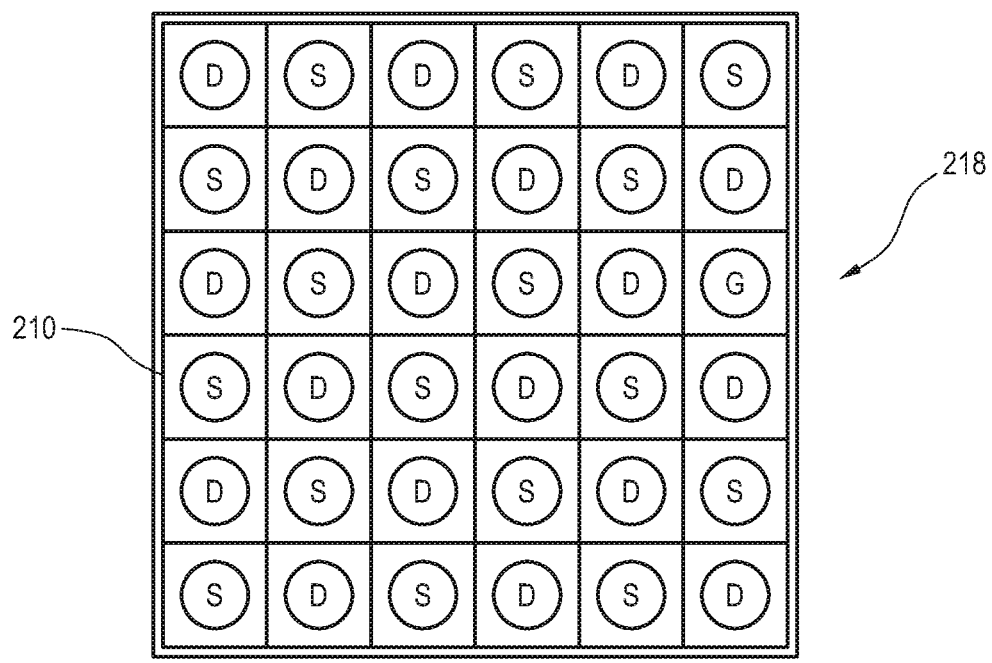

FIGS. 10a and 10b show power MOSFET 210 contained within ball grid array (BGA) package 218 having dimensions of 3.175 mm×3.175 mm. Power MOSFET 210 containing a striped array of interconnected MOSFET cells 130 covers most of the die or package area. The external contacts S are electrically connected to conductive trace 212 for N+ source region 166, contacts G are electrically connected to conductive trace 214 for polysilicon gate region 150, and contacts D are electrically connected to conductive trace 216 for N+ drain region 168. In one embodiment, contacts S, contact D, and contacts G are interconnect bumps. Power MOSFET 210 can also be configured in a flipchip type semiconductor device to minimize parasitic resistance, inductance, and capacitance and to make the device suitable for high frequency switching applications in the MHz range. For example, low voltage DC-DC converters can be made very small and have high performance by enabling high switching frequency. The low resistance 3-layer interconnect scheme 188-204 in FIG. 6r and chip-scale BGA package 218 are thermally matched to graphene with semiconducting properties or diamond region 132 enhanced substrate 120.

Figure 11:
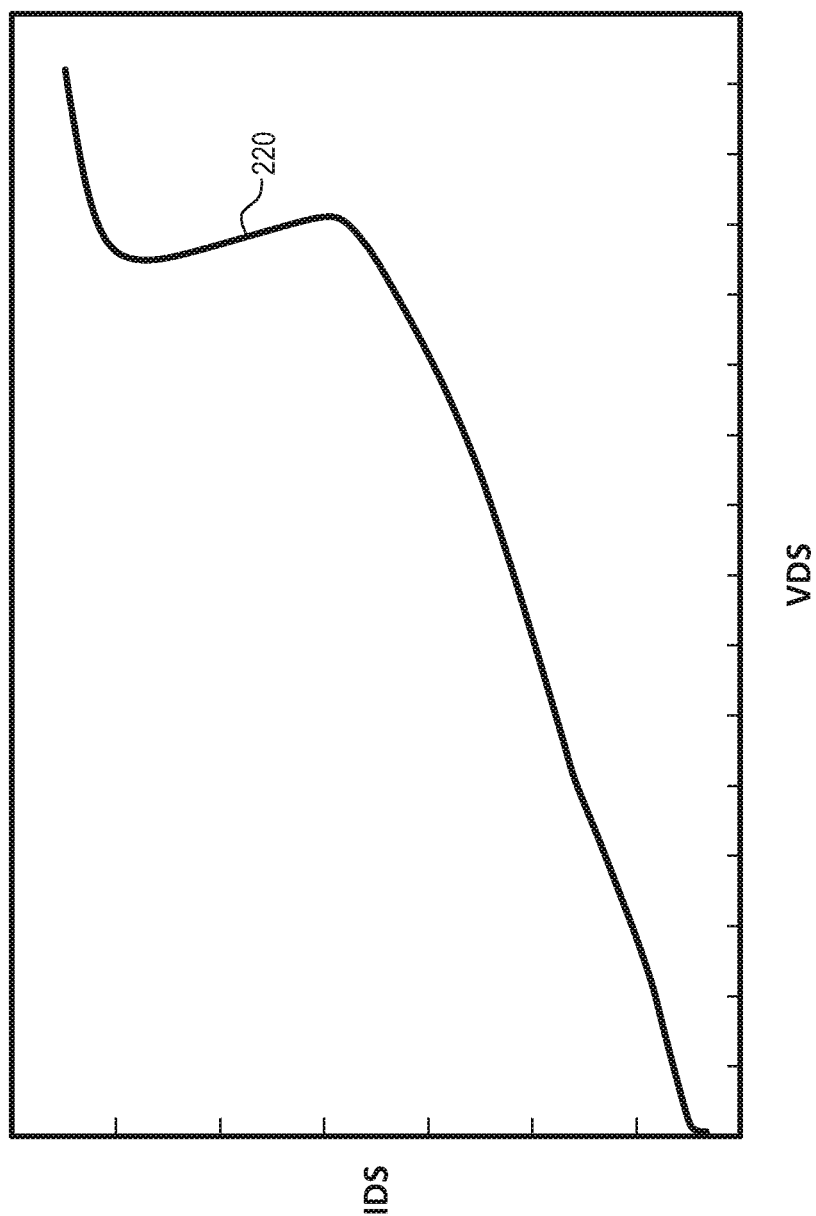
FIG. 11 is a graph of IDS and VDS for the low voltage MOSFET cell.

FIG. 11 is a graph of drain current and drain-to-source voltage for power MOSFET 210. Curve 220 represents an embodiment of a 3.3 VDC MOSFET cell according to FIG. 7.

While one or more embodiments of the present invention have been illustrated in detail, the skilled artisan will appreciate that modifications and adaptations to those embodiments may be made without departing from the scope of the present invention as set forth in the following claims.

What is claimed:

1. A semiconductor device, comprising:
   a substrate;
   a first semiconductor layer formed over the substrate;
   a graphene region with semiconducting properties or diamond region formed in a surface of the first semiconductor layer opposite the substrate;
   a second semiconductor layer formed over the surface of the first semiconductor layer and graphene region with semiconductor properties or diamond region; and
   a semiconductor component including a drain region, a channel region, and a source region formed in the second semiconductor layer, wherein the graphene region with semiconducting properties or diamond region is disposed between the drain region and source region and separated from the channel region of the semiconductor component by at least a portion of the second semiconductor layer.

2. The semiconductor device of claim 1, wherein the semiconductor component includes a MOSFET, IGBT, or CTIGBT.

3. The semiconductor device of claim 2, further including forming the graphene region with semiconducting properties or diamond region under a gate region of the MOSFET, IGBT, or CTIGBT.

4. The semiconductor device of claim 2, wherein the MOSFET, IGBT, or CTIGBT with the graphene region with semiconducting properties or diamond region exhibits reduced drain to source resistance by a factor of 50-200% over an absence of the graphene region.

5. The semiconductor device of claim 1, wherein the graphene region with semiconducting properties or diamond region reduces resistance for the semiconductor component by a factor of 50-200% over an absence of the graphene region.

6. The semiconductor device of claim 1, wherein the substrate includes silicon, silicon carbide, gallium arsenide, gallium nitride, germanium, or indium phosphide.

7. A semiconductor device, comprising:
   a substrate;
   a first semiconductor layer formed over the substrate;
   a graphene region with semiconducting properties or diamond region disposed in a surface of the first semiconductor layer opposite the substrate;
   a second semiconductor layer formed over the surface of the first semiconductor layer and graphene region with semiconductor properties or diamond region; and
   a MOSFET including a drain region, a channel region, and source region formed in the second semiconductor layer, wherein the graphene region with semiconducting properties or diamond region is disposed under the channel region and separated from the channel region of the semiconductor component by the second semiconductor layer.

8. The semiconductor device of claim 7, wherein the substrate includes silicon, silicon carbide, gallium arsenide, gallium nitride, germanium, or indium phosphide.

9. The semiconductor device of claim 7, further including forming the graphene region with semiconducting properties or diamond region under a gate region of the MOSFET.

10. The semiconductor device of claim 7, wherein the MOSFET with the graphene region with semiconducting properties or diamond region exhibits reduced drain to source resistance by a factor of 50-200% over an absence of the graphene region.

11. The semiconductor device of claim 7, wherein the graphene region with semiconducting properties or diamond region reduces resistance for the MOSFET by a factor of 50-200% over an absence of the graphene region.

12. The semiconductor device of claim 7, further including an interconnect structure formed over the MOSFET.

13. The semiconductor device of claim 7, wherein forming the semiconductor component includes:
    a gate structure formed over a surface of the substrate;
    a source region formed within the substrate adjacent to the gate structure; and
    a drain region formed within the substrate adjacent to the gate structure opposite the source region.

14. A method of making a semiconductor device, comprising:
    providing a substrate;
    forming a first semiconductor layer over the substrate;
    forming a graphene region with semiconducting properties or diamond region in a surface of the first semiconductor layer opposite the substrate;
    forming a second semiconductor layer over the surface of the first semiconductor layer and graphene region with semiconductor properties or diamond region; and
    forming second a semiconductor component including a channel region in the second semiconductor layer, wherein the graphene region with semiconducting properties or diamond region is disposed under the channel region and separated from the channel region of the semiconductor component by the second semiconductor layer.

15. The method of claim 14, wherein the substrate includes silicon, silicon carbide, gallium arsenide, gallium nitride, germanium, or indium phosphide.

16. The method of claim 14, wherein the semiconductor component includes a MOSFET, IGBT, or CTIGBT.

17. The method of claim 16, further including forming the graphene region with semiconducting properties or diamond region under a gate region of the MOSFET, IGBT, or CTIGBT.

18. The method of claim 16, further including forming the graphene region with semiconducting properties or diamond region to reduce drain source resistance of the MOSFET, IGBT, or CTIGBT by a factor of 50-200% over an absence of the graphene region.

19. The method of claim 14, wherein the graphene region with semiconducting properties or diamond region reduces resistance for the semiconductor component by a factor of 50-200% over an absence of the graphene region.

20. The method of claim 14, further including forming an interconnect structure over the semiconductor component.

21. The method of claim 20, wherein forming the interconnect structure over the semiconductor component includes metal interconnect layers made from graphene, copper, or aluminum.

22. A semiconductor device, comprising:
    a substrate;

a first semiconductor layer formed over the substrate;

a graphene region or diamond region disposed in a surface of the first semiconductor layer opposite the substrate;

a second semiconductor layer formed over the surface of the first semiconductor layer and graphene region or diamond region; and a MOSFET including a channel region formed in the second semiconductor layer, wherein the graphene region or diamond region is disposed under the channel region.

23. The semiconductor device of claim 22, wherein the graphene region includes semiconducting properties.

24. The semiconductor device of claim 22, wherein the substrate includes silicon, silicon carbide, gallium arsenide, gallium nitride, germanium, or indium phosphide.

25. The semiconductor device of claim 22, further including forming the graphene region or diamond region under a gate region of the MOSFET.

26. The semiconductor device of claim 22, wherein the MOSFET with the graphene region or diamond region exhibits reduced drain to source resistance by a factor of 50-200% over an absence of the graphene region.

27. The semiconductor device of claim 22, wherein the graphene region or diamond region reduces resistance for the MOSFET by a factor of 50-200% over an absence of the graphene region.

28. The semiconductor device of claim 22, further including an interconnect structure formed over the MOSFET.

29. The semiconductor device of claim 22, wherein forming the semiconductor component includes:

a gate structure formed over a surface of the substrate;

a source region formed within the substrate adjacent to the gate structure; and a drain region formed within the substrate adjacent to the gate structure opposite the source region.

30. The semiconductor device of claim 22, wherein the graphene region or diamond region is separated from the channel region of the semiconductor component by at least a portion of the second semiconductor layer.

* * * * *